US011522502B2

(12) United States Patent
Tang et al.

(10) Patent No.: US 11,522,502 B2
(45) Date of Patent: Dec. 6, 2022

(54) WIDEBAND RADIO-FREQUENCY TRANSCEIVER FRONT-END AND OPERATION METHOD THEREOF

(71) Applicants: IMEC VZW, Leuven (BE); VRIJE UNIVERSITEIT BRUSSEL, Brussels (BE)

(72) Inventors: Xinyan Tang, Leuven (BE); Pierre Wambacq, Groot-Bijgaarden (BE)

(73) Assignees: IMEC VZW, Leuven (BE); VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 17/464,631

(22) Filed: Sep. 1, 2021

(65) Prior Publication Data

US 2022/0123695 A1    Apr. 21, 2022

(30) Foreign Application Priority Data

Oct. 15, 2020    (EP) .................................... 20201999

(51) Int. Cl.
| | | |
|---|---|---|
| *H03F 1/42* | (2006.01) | |
| *H03F 3/24* | (2006.01) | |
| *H04B 1/40* | (2015.01) | |

(52) U.S. Cl.
CPC .............. *H03F 1/42* (2013.01); *H03F 3/245* (2013.01); *H04B 1/40* (2013.01); *H03F 2200/36* (2013.01); *H03F 2200/451* (2013.01)

(58) Field of Classification Search
CPC .. H03F 1/42; H03F 2200/36; H03F 2200/451; H03F 3/245; H04B 1/0458; H04B 1/18; H04B 1/40; H04B 1/44
See application file for complete search history.

(56) References Cited

U.S. PATENT DOCUMENTS 9,219,518 B1    12/2015  Chen et al.
10,498,298 B1 *  12/2019  Wang ...................... H03F 3/191
(Continued)

FOREIGN PATENT DOCUMENTS

WO    2007073253 A1    6/2007

OTHER PUBLICATIONS

European Patent Office; Extended European Search Report for EP Application No. 20201999.8, 5 pages, dated Feb. 24, 2021.
(Continued)

*Primary Examiner* — David S Huang
(74) *Attorney, Agent, or Firm* — McDonnell Boehnen Hulbert & Berghoff LLP

(57) ABSTRACT

A wideband radio-frequency transceiver front-end is provided. The transceiver front-end includes an antenna port and a transmission path coupled to the antenna port comprising a power amplifier and a first matching network. The transceiver front-end further includes a reception path coupled to the antenna port comprising a low noise amplifier and a second matching network. Furthermore, the transceiver front-end includes an impedance inverter coupled in-between the antenna port and the second matching network. Moreover, the transceiver front-end includes a controller comprising switching arrangement for a gate and a drain of the power amplifier. In this context, the controller is configured to initiate a first reception mode by connecting the gate of the power amplifier to ground and by connecting the drain of the power amplifier to a supply voltage.

20 Claims, 8 Drawing Sheets

(56) References Cited

U.S. PATENT DOCUMENTS

| | | |
|---|---|---|
| 10,693,231 B2 | 6/2020 | Dunworth et al. |
| 2007/0232241 A1 | 10/2007 | Carley et al. |
| 2008/0279262 A1 | 11/2008 | Shanjani |
| 2019/0393923 A1 | 12/2019 | Maxim et al. |
| 2020/0059208 A1 | 2/2020 | Yang et al. |
| 2020/0083924 A1 | 3/2020 | Callender et al. |
| 2021/0044318 A1* | 2/2021 | Callender ................ H03H 7/38 |

OTHER PUBLICATIONS

Stefano Pellerano et al.; "A scalable 71-to-76Ghz 64-element phased-array transceiver module with 2×2 direct-conversion IC in 22nm FinFet CMOS technology"; In 2019 IEEE International Solid-State Circuits Conference—(ISSCC), pp. 1-30. IEEE, 2019.

Jeremy D. Dunworth et al.; "A 28GHz Bulk-CMOS dual-polarization phased-array transceiver with 24 channels for 5G user and basestation equipment"; In 2018 IEEE International Solid-State Circuits Conference—(ISSCC), pp. 1-38. IEEE, 2018.

Sergio Saponara and Bruno Neri; "mm-wave integrated wireless transceiver: enabling technology for high bandwidth short-range networking in cyber physical systems"; Microsystem Technologies 22, No. 7 (2016): 1893-1903; published online Mar. 9, 2016.

Xiao Xiao, Pratt, Amanda; Bonjern Yang, Angie Wang, Ali M. Niknejad, Elad Alon, and Borivoje Nikolić; "A 65-nm CMOS wideband TDD front-end with integrated T/R switching via PA re-use"; IEEE Journal of Solid-State Circuits, vol. 52, No. 7 (Jul. 2017): 1768-1782.

Wei Zhu, Lei Zhang, and Yan Wang; "A 10.56-GHz broadband transceiver with integrated T/R switching via matching network reuse and 0.3-2.1-GHz baseband in 28-nm CMOS technology"; IEEE Transactions on Microwave Theory and Techniques vol. 67, No. 7 (Jul. 2019): 2599-2617.

Bodhisatwa Sadhu et al.; "A 28GHz 32-element phased-array transceiver IC with concurrent dual polarized beams and 1.4 degree beam-steering resolution for 5G communication"; In 2017 IEEE International Solid-State Circuits Conference (ISSCC), pp. 1-54. IEEE, 2017.

* cited by examiner

WIDEBAND RADIO-FREQUENCY TRANSCEIVER FRONT-END AND OPERATION METHOD THEREOF

CROSS-REFERENCE TO RELATED APPLICATIONS

The present application is a non-provisional patent application claiming priority to European Patent Application No. EP 20201999.8 filed Oct. 15, 2020, the contents of which are hereby incorporated by reference.

FIELD OF THE DISCLOSURE

This disclosure generally pertains to transceivers and methods of operation thereof. More particularly, this disclosure pertains to wideband radio-frequency transceivers.

BACKGROUND

This description relates to a radio-frequency (RF) transceiver operating at millimeter waves or Terahertz frequencies, especially to a wideband front-end circuit for wireless communication in time-division duplexing (TDD) systems.

Generally, in a TDD RF transceiver front-end, noise figure (NF) acts as the key specification, especially while the transceiver is in receiving mode, which affects the system performance significantly. Presently, wide operational bandwidth is available for wireless communication at millimeter waves and Terahertz frequencies. However, it is hard to keep a low NF for the entire wide operation bandwidth. In order to maintain good RF performance for TDD RF transceiver front-end at millimeter waves, a low NF of the front-end circuit is required within a wide operation bandwidth.

For example, the document US 2020/0083924 A1 shows a transmit receive switch system, where a symmetric $\lambda/4$ transmission line switching topology is incorporated in order to perform impedance matching on both transmitter and receiver ends. However, the presence of passive components at the transmission path disadvantageously leads to higher insertion loss, especially at higher frequencies (Terahertz), which results in lower output power from the power amplifier at the transmitter end.

This description pertains to providing a wideband RF transceiver front-end and an operation method for the same, which can overcome the aforementioned limitations.

SUMMARY

This description describes features of a wideband RF transceiver front-end and features of a method, as well as further developments.

According to a first example implementation, a wideband radio-frequency transceiver front-end is provided. The transceiver front-end includes an antenna port and a transmission path coupled to the antenna port comprising a power amplifier and a first matching network. The transceiver front-end further includes a reception path coupled to the antenna port comprising a low noise amplifier and a second matching network. Furthermore, the transceiver front-end includes an impedance inverter coupled in-between the antenna port and the second matching network. Moreover, the transceiver front-end includes a controller comprising switching arrangement for a gate and a drain of the power amplifier.

In this context, the controller is configured to initiate a first reception mode by connecting the gate of the power amplifier to ground and by connecting the drain of the power amplifier to a supply voltage. In at least some cases, this eliminates the necessity of having passive elements at the transmission path by introducing additional switching functionalities at the power amplifier. Especially, while receiving, a first mode of operation can occur in which the transmitter power amplifier is not completely switched off, instead configures the LC resonance of the coil of the first matching network and the equivalent drain capacitance of transistors. Consequently, while receiving, the impedance looking into the transmission path from the receiving path changes according to the operation frequency. This can reduce the NF.

According to at least some instances of the first example implementation, the controller is further configured to initiate a second reception mode by connecting the gate of the power amplifier to a bias voltage and by connecting the drain of the power amplifier to ground. Therefore, while receiving, a second mode of operation that further manipulates the impedance transformation at the transmission path can occur. Hence, the combined operation of the first reception mode and the second reception mode can facilitate a low NF for a wide operation bandwidth.

According to at least some other instances of the first example implementation, the transceiver front-end further comprises a shunt switch coupled to the low noise amplifier. In this regard, the controller is further configured to initiate a transmission mode by switching on the shunt switch, thereby creating a low impedance short across the low noise amplifier. In addition to this, the controller is further configured to connect the gate of the power amplifier to a bias voltage and the drain of the power amplifier to the supply voltage during the transmission mode.

In at least some instances of the first example implementations, the shunt switch is placed across the input of the low noise amplifier, i.e., between the second matching network and the input terminals of the low noise amplifier. This provides an Electrostatic Discharge (ESD) protection topology, since any potential ESD-event current from the antenna port will be led to ground through the matching networks.

According to at least some other instances of the first example implementation, the controller is further configured to cause the shunt switch to be off during the first reception mode and/or the second reception mode. In this context, the controller may also be configured to control timing of the shunt switch when transferring from the transmission mode to the first and/or second reception mode.

According to at least some other instances of the first example implementation, the controller further comprises a switching arrangement for a gate of the low noise amplifier. In this regard, the controller is further configured to connect the gate of the low noise amplifier to ground during the transmission mode. Additionally or alternately, the controller is further configured to connect the gate of the low noise amplifier to a bias voltage during the first reception mode and/or the second reception mode. In addition, the second matching network is further configured to not only transform impedance but also to compensate any parasitic associated with the shunt switch (both on and off states) as well as for the transistors of the low noise amplifier.

According to at least some other instances of the first example implementation, the impedance inverter is a quarter-wavelength ($\lambda/4$) transmission line, configured to perform a short-to-open impedance transformation. Moreover, the impedance inverter can be implemented as a transmission line that has a length of less than $\lambda/4$ in order to match the additional impedance contribution of the second matching network.

According to at least some other instances of the first example implementation, the controller is further configured to initiate the first reception mode for a frequency band over an operating frequency band greater than or less than or equal to a center frequency. Additionally or alternately, the controller is further configured to initiate the second reception mode for a frequency band over the operating frequency band greater than or less than or equal to the center frequency.

The matching network parameters can dictate the modes of operation with respect to the operating frequency, i.e. whether it is required to initiate the first or second reception mode above or below the center frequency of the whole operation bandwidth. Operating at the center frequency is an example case among the all the possible operating frequency cases.

According to at least some other instances of the first example implementation, the operating frequency band is in the range of millimeter band. In some of the implementations, the frequency band goes up into a Terahertz frequency band. For instance, the operating frequency band can be the whole D-band, where the center frequency can be at or around 150 GHz. A wide operation bandwidth can be incorporated and by means of the first and second reception modes, a low NF is maintained throughout the operation bandwidth.

According to at least some other instances of the first example implementation, the first matching network and the second matching network are transformer based matching networks, such as transformer-type baluns. However, the first impedance matching network and/or the second impedance matching network are not limited to transformer-type baluns. For instance, the second matching network can be implemented as a LC-based matching network, i.e. the low noise amplifier is configured as single-ended version.

According to a second example implementation, a method for operating a wideband radio-frequency transceiver front-end is provided. The method comprises providing a transmission path, comprising a power amplifier and a first matching network, coupled to an antenna port. The method further comprises providing a reception path, comprising a low noise amplifier and a second matching network, coupled to the antenna port. Furthermore, the method comprises providing an impedance inverter coupled in-between the antenna port and the second matching network. Moreover, the method comprises initiating a first reception mode by connecting a gate of the power amplifier to ground and by connecting a drain of the power amplifier to a supply voltage.

According to at least some instances of the second example implementation, the method further comprises initiating a second reception mode by connecting the gate of the power amplifier to a bias voltage and by connecting the drain of the power amplifier to ground. Therefore, a transceiver front-end that operates over a wide operation bandwidth can be provided, while facilitating higher output power and higher power efficiency for the transmitter power amplifier and further maintains a low NF for the entire operation bandwidth.

According to at least some other instances of the second example implementation, the method further comprises initiating a transmission mode by switching on a shunt switch coupled to the low noise amplifier and further by connecting the gate of the power amplifier to a bias voltage and the drain of the power amplifier to the supply voltage. In addition to switching the transmission and reception path only by switching a single switch, a provision for ESD protection can also be incorporated.

According to at least some other instances of the second example implementation, the method further comprises initiating the first reception mode for a frequency band greater than or less than or equal to a center frequency and initiating the second reception mode for a frequency band greater than or less than or equal to the center frequency over an operating frequency band. Therefore, a flexible operation for the first and second reception modes is incorporated with respect to the operating bandwidth.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Reference will now be made in detail to the example embodiments illustrated in the accompanying drawings. The following embodiments may, however, be variously modified and the range of the claims is not limited by the following embodiments.

Figure 1:
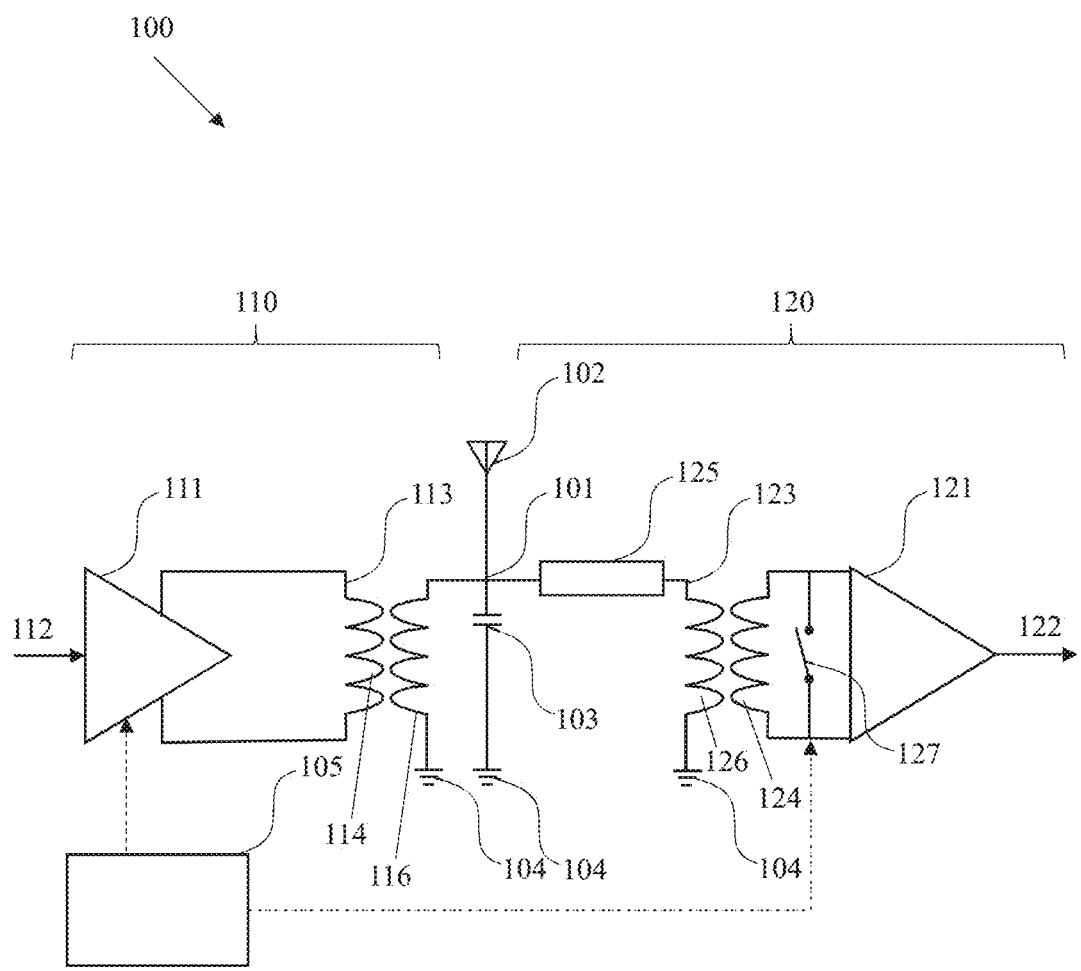
FIG. 1 shows a transceiver front-end according to according to an example embodiment.

FIG. 1 illustrates an example embodiment of the transceiver front-end 100. The transceiver front-end 100 comprises an antenna port 101 and an antenna or antenna array 102 coupled at the antenna port 101, which is terminated to ground 104. The parasitic for termination is hereby illustrated as a pad capacitance 103 (e.g., a flip chip pad capacitance). The antenna or antenna array 102 can operate at millimeter wave as well as at sub-millimeter wave.

The transceiver front-end 100 further comprises a transmission path 110 that is coupled to the antenna port 101. The transmission path 110 comprises a transmitter amplifier or transmitter power amplifier or power amplifier 111 and a first matching network 113, such as a first transformer based impedance matching network. The power amplifier 111 receives baseband signal 112 from a baseband generator (not shown) and performs the final stage amplification to generate the transmission signal, which is transmitted through the antenna or antenna array 102 during transmission. Specifically, the power amplifier 111 operates in differential mode, where the received baseband and the amplified output signals are differential type signals. The output of the power amplifier 111 is coupled to the first coil 114 of the first matching network 113. The second coil 116 of the first matching network 113 is coupled to the antenna port 101.

The transceiver front-end 100 further comprises a reception path 120 that is coupled to the antenna port 101. The reception path comprises a receiver amplifier or receiver low noise amplifier or low noise amplifier 121, a second matching network 123 (such as a second transformer based impedance matching network), and an impedance inverter 125. The low noise amplifier 121 amplifies the received signal, which is received through the antenna or antenna array 102 during reception and provides amplified received signal 122 at its output. Specifically, the low noise amplifier 121 operates in differential mode, where the received signal and the amplified received signal are differential type signals.

The input terminals of the low noise amplifier, i.e., the gates of the transistors, are coupled to a switch 127 in shunt, hereinafter referred as a shunt switch 127. The terminals are further coupled to the first coil 124 of the second matching network 123. The second coil 126 of the second matching network 123 is coupled to an impedance inverter. In at least some embodiments, the impedance inverter is realized by a transmission line having a length shorter than one quarter-wavelength. In other words, the impedance inverter 125 is coupled in-between the antenna port 101 and the second coil 126 of the second matching network 123.

It is to be noted that the second matching network 123 is not limited to a transformer based matching network, since a LC based matching network can also be implemented, where the low noise amplifier 121 will perform single-ended operation.

The transceiver front-end 100 further comprises a controller 105 that operates on the shunt switch 127, therefore is configured to cause the shunt switch 127 to be on and off as needed for transmission and reception operations, respectively. The controller 105 further includes provisions for different voltage levels, i.e., the supply voltage Vdd, the gate bias voltage Vg and its variances, and ground potential (0V). Especially, the controller 105 comprises supply switch or switches in order to perform the switching of potentials ranging from the ground potential (0V) to the supply voltage (Vdd). The switch control logic can be transmitted via control signals (depicted as dashed lines) from the controller 105 to the respective paths 110, 120.

Figure 2:
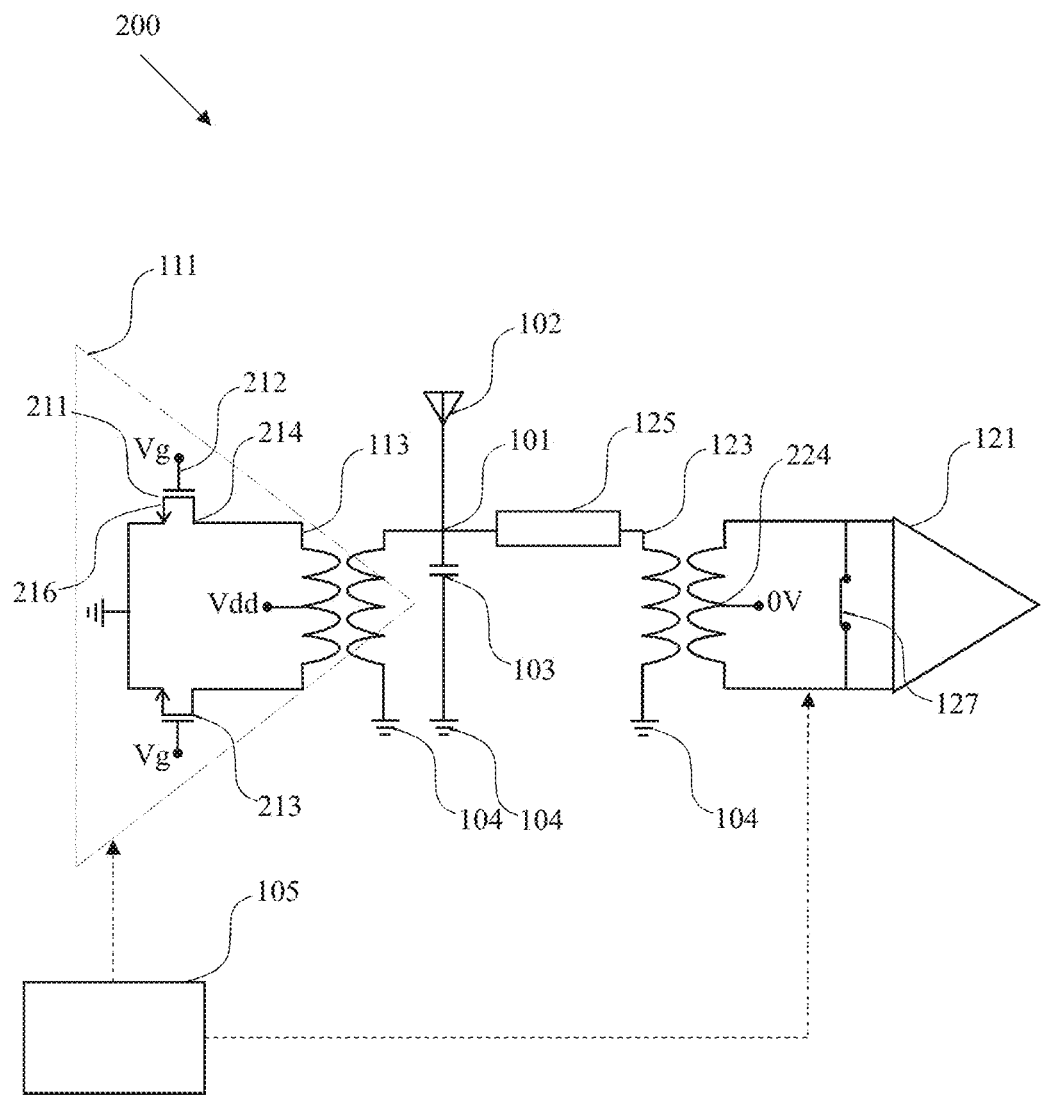
FIG. 2 shows a transceiver front-end in transmission mode according to an example embodiment.

Next, FIG. 2 illustrates an example embodiment of the transceiver front-end in transmission mode 200, hereinafter referred as TX-mode. The power amplifier 111 illustrated in detail, showing the differential arrangement of two transistors 211, 213 with their respective gate 212, drain 214 and source 216 terminals. Although, the topology shows only one transistor per path, it is conceivable that the topology can be extended to a larger number of stacked-transistor power amplifier topology. Furthermore, the power amplifier 111 can also be implemented as a cross-capacitive coupled common source power amplifier.

In order to initiate the TX-mode 200, the controller 105 causes the shunt switch 127 to be on, thereby creating a low impedance short across the inputs of the low noise amplifier 121 (i.e. across the first coil 124 of the second matching network 123). In addition, the controller 105 connects the gates 224 of the low noise amplifier 121 (i.e., the transistor switches of the low noise amplifier 121) to ground 104 (0V). This results in the deactivation of the reception path 120 while keeping the transmission path 110 active.

The second matching network 123 allows avoiding the termination of the inactive reception path directly to ground 104. The second matching network 123 also takes into account the parasitic associated with the shunt switch 127 when it is switched on.

The low impedance short caused by the shunt switch 127 across the first coil 124 of the second matching network 123 is transformed into a high impedance by the impedance inverter 125, seen at the antenna port 101 from the perspective of the power amplifier 111. The impedance inverter 125 is, for instance, a transmission line that has a length of slightly less than $\lambda/4$, which takes into account the additional impedance contribution of the second matching network 123. The combined operation of the impedance inverter 125 and the second matching network 123 provides a combined impedance transformation of $\lambda/4$. The high impedance can be achieved based on resonance between cumulative capacitance of transmission line and pad capacitances and the transmission line impedance of the impedance inverter 125.

Furthermore, during the TX-mode 200, the controller 105 connects the drain of the power amplifier 111, especially the drains 214 of the transistors 211, 213 to a supply voltage Vdd. The controller 105 further connects the gate of the power amplifier 111, especially the gates 212 of the transistors to a bias voltage Vg. The voltage switching is performed at a center tap of the first coil 114 of the first matching network 113 and at a center tap of the first coil 124 of the second matching network 123 for the power amplifier 111 and the low noise amplifier 121, respectively.

Figure 3:
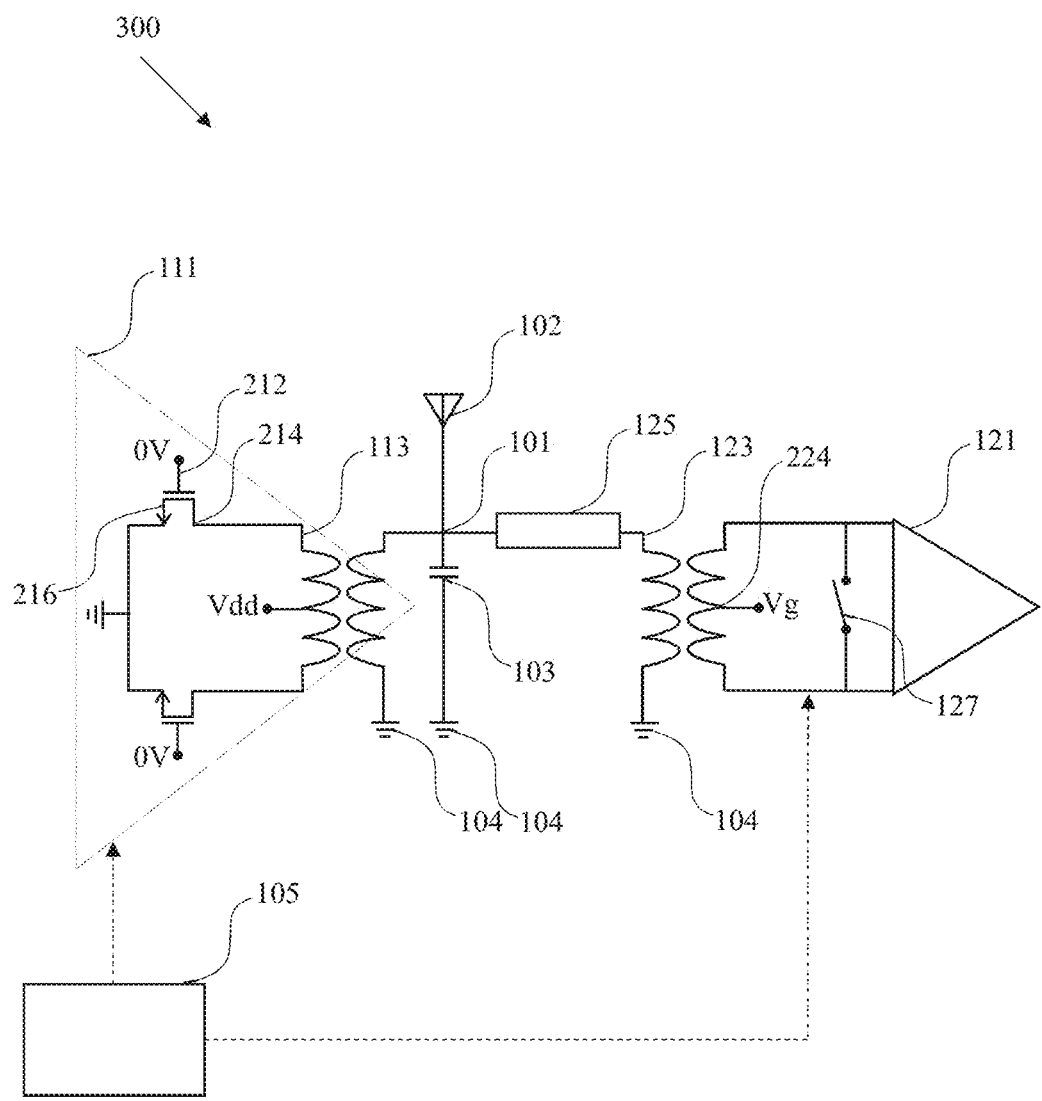
FIG. 3 shows a transceiver front-end in reception mode according to an example embodiment.

Next, FIG. 3 illustrates a first example embodiment of the transceiver front-end in reception mode 300, hereinafter referred as PA-SW-OFF. In order to initiate the PA-SW-OFF 300, the controller 105 connects the gate of the power amplifier 111, especially the gates 212 of the transistors to ground 104 (0V). Furthermore, the controller 105 connects the drain of the power amplifier 111, especially the drains 214 of the transistors to the supply voltage Vdd. This effectively disables the power amplifier 111 to a high impedance state, which provides adequate isolation from the antenna port 101, thereby deactivating the transmission path 110.

Moreover, during the PA-SW-OFF 300, the controller 105 causes the shunt switch 127 to be off, which presents an off switch capacitance across the low noise amplifier 121 (i.e., across the first coil 124 of the second matching network 123). In addition, the controller 105 connects the gate of the low noise amplifier 121, especially the gates 224 of the transistors to the bias voltage Vg, thereby activating the reception path 120. The second matching network 123 further takes into account the parasitic associated with the shunt switch 127 when it is switched off.

Figure 4:
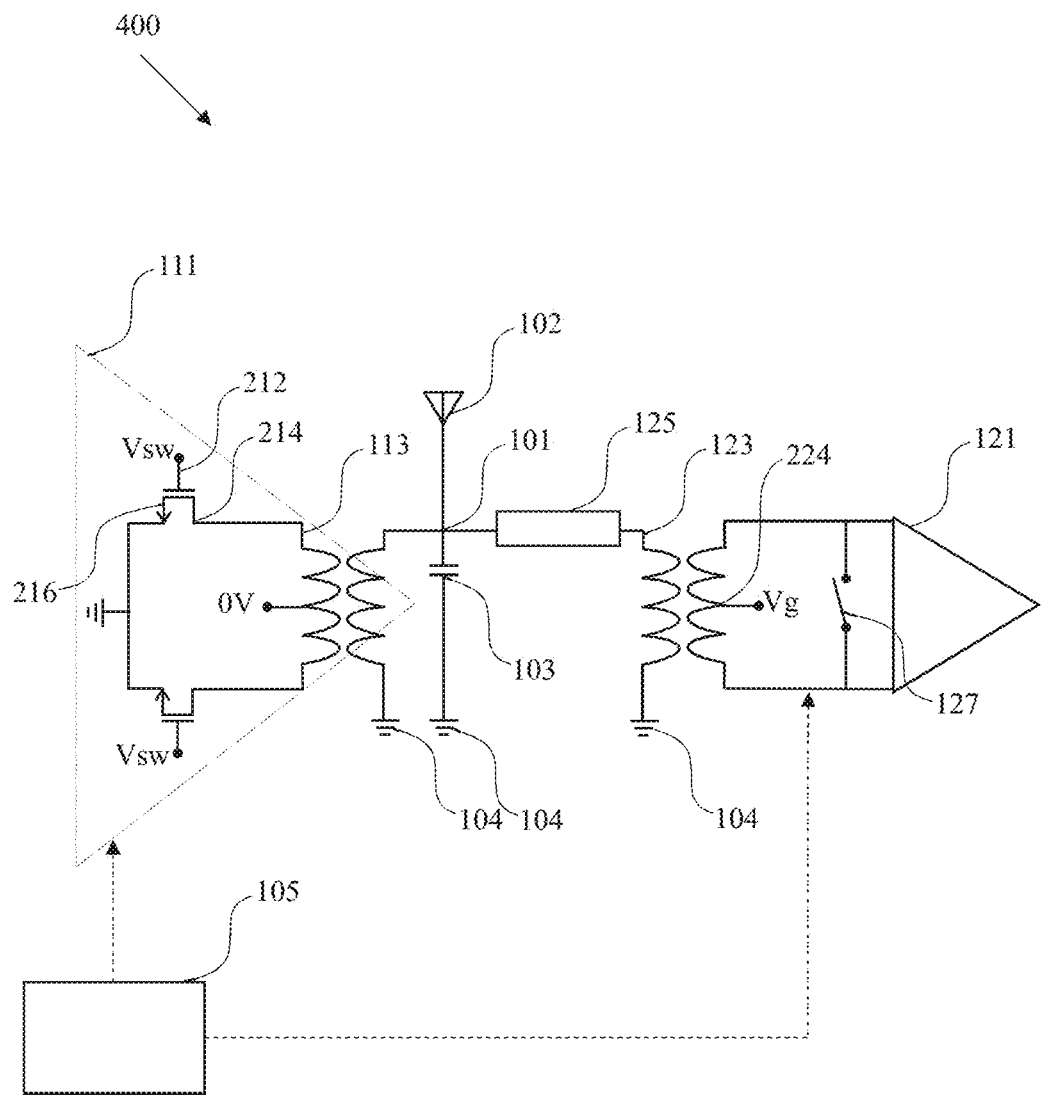
FIG. 4 shows a transceiver front-end in reception mode according to an example embodiment.

Next, FIG. 4 illustrates a second example embodiment of the transceiver front-end 400, hereinafter referred as PA-SW-ON, in reception mode. In order to initiate the PA-SW-ON 400, the controller 105 connects the gate of the power amplifier 111, especially the gates 212 of the transistors to a bias voltage Vsw. The bias voltage Vsw can be lower or higher than the nominal bias voltage Vg. The bias voltage Vsw can be within the range of the nominal bias voltage Vg and the supply voltage Vdd. Alternately, the bias voltage Vsw is as high as the supply voltage Vdd. In at least some embodiments, the bias voltage Vsw is sufficiently high in order to enable the transistors of the power amplifier 111 to stay in the ohmic region.

Furthermore, the controller 105 connects the drain of the power amplifier 111, especially the drains 214 of the transistors to the ground 104 (0V). Hence, during PA-SW-ON 400, the gate biasing voltages of the power amplifier 111 are set to a certain value to turn on the transistors while grounding the supply voltage of the power amplifier 111. This effectively configures the power amplifier 111 to a low impedance shunt switch. The first matching network 113 performs a short to open impedance transform, i.e., transforming the low impedance of the power amplifier 111 operating as a low impedance shunt switch into a high impedance. This provides adequate isolation from the antenna port 101, thereby deactivating the transmission path 110.

Moreover, during the PA-SW-ON 400, the controller 105 causes the shunt switch 127 to be off, which presents an off switch capacitance across the low noise amplifier 121 (i.e., across the first coil 124 of the second matching network 123). In addition, the controller 105 connects the gate of the low noise amplifier 121, especially the gates 224 of the transistors to the bias voltage Vg, thereby activating the reception path 120. The second matching network 123 further takes into account the parasitic associated with the shunt switch 127 when it is switched off.

Therefore, during the TX-mode 200, the power amplifier 111 operates as a large amplifying device, while the low impedance short across the low noise amplifier 121 is converted into a high impedance in order to achieve a high transmission efficiency. On the other hand, during the PA-SW-OFF 300, the power amplifier 111 is disabled to a high impedance state in order to provide good isolation and hence low NF in the receiver topology. Additionally, during the PA-SW-ON 400, the power amplifier 111 is disabled to a low impedance shunt while converting the low impedance into a high impedance at the antenna port 101. This further provides adequate isolation from the antenna port 101 and hence low NF in the receiver topology. It is to be noted that the PA-SW-OFF 300 and the PA-SW-ON 400 modes are implemented at different frequencies and they do not co-exist at one frequency.

Figure 5:
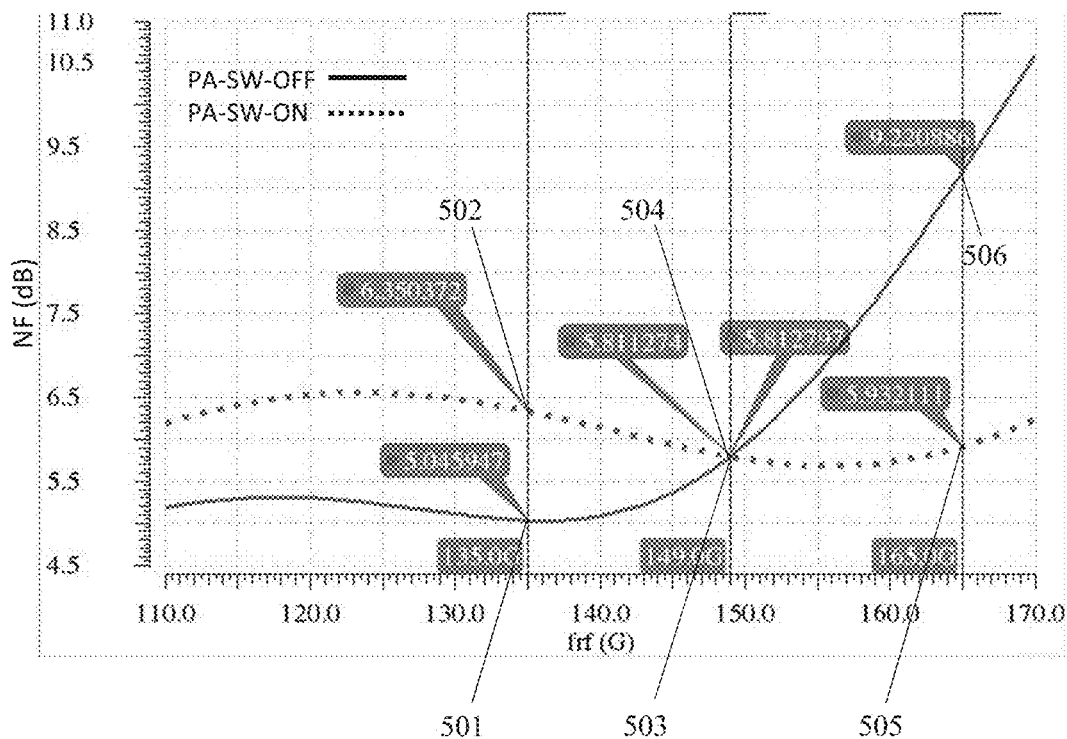
FIG. 5 shows simulation results of noise figure for the first and second reception modes according to an example embodiment.

Next, FIG. 5 illustrates example NF simulations for the PA-SW-OFF 300 and PA-SW-ON 400. The horizontal axis denotes the operating frequency range in Gigahertz and the vertical axis denotes the NF in decibels. The operation frequency range correspond to the whole D-band, as illustrated herein, where the center frequency is at or around 150 GHz. However, it is conceivable that the illustration is to exemplify the NF reduction technique and the operation frequency range is not limited to the D-band. For example, the operation frequency band can be in the range of millimeter wave as well as sub-millimeter wave range.

In this example, three observation frequencies are selected in order to demonstrate the NF fluctuation over the frequency range. A first observation frequency is selected at 135 GHz, a second observation frequency is selected around the center frequency at 149 GHz and a third observation frequency is selected at 165 GHz. The solid line represents the PA-SW-OFF 300 mode and the dashed line represents the PA-SW-ON 400 mode.

At the first observation frequency, the receiver NF 501 for PA-SW-OFF is approximately 5.05 dB and the receiver NF 502 for PA-SW-ON is approximately 6.35 dB. At the second observation frequency, the receiver NF 503 for PA-SW-OFF is approximately 5.81 dB and the receiver NF 504 for PA-SW-ON is approximately 5.81 dB. At the third observation frequency, the receiver NF 505 for PA-SW-OFF is approximately 9.22 dB and the receiver NF 506 for PA-SW-ON is approximately 5.93 dB.

It can be seen that, the NF degrades drastically for PA-SW-OFF as the operating frequency increases, whereas the NF is somewhat constant for PA-SW-ON over the whole frequency range. However, at lower frequencies, especially below the center frequency, the NF performance for PA-SW-OFF is superior to the NF performance for PA-SW-ON by approximately 1 dB. Therefore, the example embodiments can incorporate both PA-SW-OFF and PA-SW-ON modes over the whole operation bandwidth, where one mode is active for frequencies lower that the center frequency and the other mode is active for frequencies higher that the center frequency.

In this example, it can be seen that the NF performance of PA-SW-OFF is superior to PA-SW-ON for frequencies lower than the center frequency, therefore the PA-SW-OFF is initiated for frequencies lower than the center frequency. Further, the PA-SW-ON is initiated for frequencies higher than the center frequency, since the NF performance of PA-SW-ON is superior to the PA-SW-OFF for frequencies higher than the center frequencies. However, for other range of operating frequency bands, the initiation of both PA-SW-OFF and PA-SW-OFF with respect to their operating frequency range largely depends on the matching network parameters.

Figure 6:
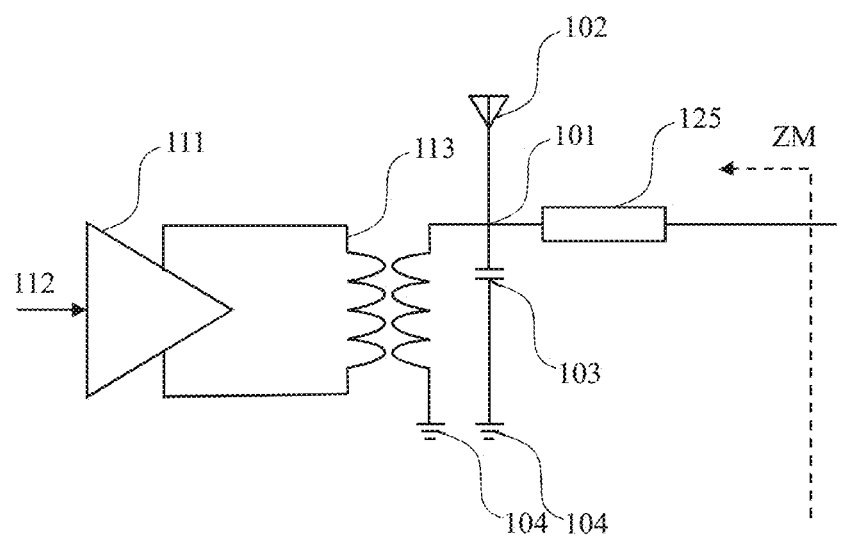
FIG. 6 shows a test bench environment for simulating noise figure degradation due to transmission path loss according to an example embodiment.
Figure 7:
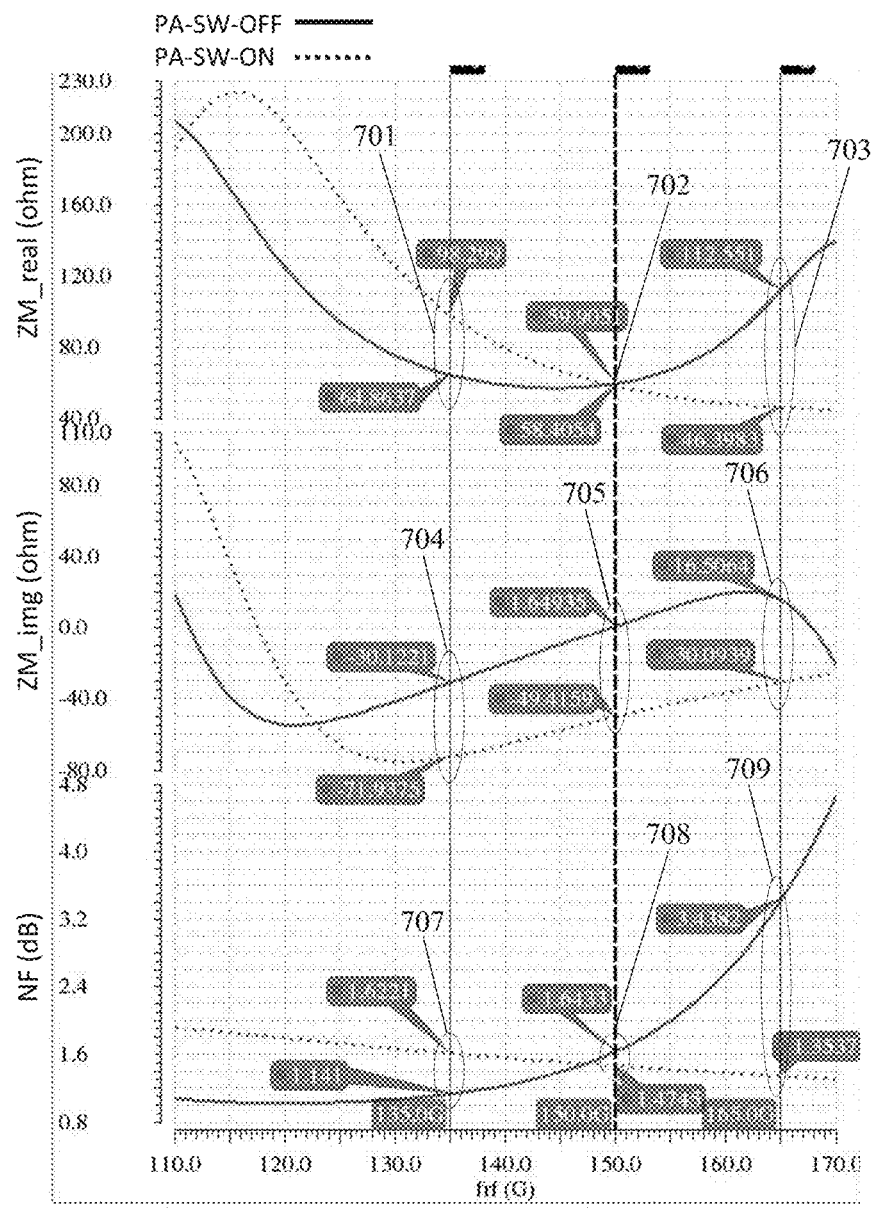
FIG. 7 shows simulation results of matching impedance and noise figure for the setup of FIG. 6 according to an example embodiment.

Along FIG. 6 and FIG. 7, an example test bench environment simulating NF degradation due to transmission path loss is shown. In particular, FIG. 6 shows an adopted test bench for simulating the NF degradation due to transmission path loss. The simulated impedance ZM looking into the transmission path and NF over frequencies are illustrated in FIG. 7.

The operation frequency range illustrated herein corresponds to the whole D-band, where the center frequency is at 150 GHz. However, it is conceivable that the illustration is to exemplify the NF degradation and the operation frequency range is not limited to the D-band. The operation frequency band can be in the range of millimeter wave as well as sub-millimeter wave range.

The horizontal axis denotes the operating frequency range in Gigahertz. The vertical axis for the simulation at top denotes the real ZM in ohm. In addition, the vertical axis for the simulation at middle denotes the imaginary ZM in ohm. Further, the vertical axis for the simulation at bottom denotes the NF in decibels. For all three simulations, three observation frequencies are selected over the frequency range. A first observation frequency is selected at 135 GHz, a second observation frequency is selected at the center frequency at 150 GHz and a third observation frequency is selected at 165 GHz. The solid line represents the PA-SW-OFF 300 mode and the dashed line represents the PA-SW-ON 400 mode.

For the simulation at top, the real value of ZM at 135 GHz, denoted by the circle 701, is around 65 ohm and 98 ohm for PA-SW-OFF and PA-SW-ON, respectively. In addition, the real value of ZM at 150 GHz, denoted by the circle 702, is around 58 ohm and 60 ohm for PA-SW-OFF and PA-SW-ON, respectively. Furthermore, the real value of ZM at 165 GHz, denoted by the circle 703, is around 113 ohm and 46 ohm for PA-SW-OFF and PA-SW-ON, respectively.

For the simulation at middle, the imaginary value of ZM at 135 GHz, as denoted by the circle 704, is around −30 ohm and −72 ohm for PA-SW-OFF and PA-SW-ON, respectively. In addition, the imaginary value of ZM at 150 GHz, denoted by the circle 705, is around 2 ohm and −49 ohm for PA-SW-OFF and PA-SW-ON, respectively. Furthermore, the imaginary value of ZM at 165 GHz, denoted by the circle 706, is around 17 ohm and −30 ohm for PA-SW-OFF and PA-SW-ON, respectively.

It is to be noted that the combined ZM of PA-SW-OFF and PA-SW-ON modes over the whole operating frequency range has less variations that the individual ZM in PA-SW-OFF and PA-SW-ON mode, respectively. As a consequence, the matching networks, especially the second matching network 123, will be benefited significantly by the proposed technique.

For the simulation at bottom, which illustrates NF degradation due to transmission path loss, the NF at 135 GHz, as denoted by the circle 707, is around 1.1 dB and 1.6 dB for PA-SW-OFF and PA-SW-ON, respectively. In addition, the NF at 150 GHz, as denoted by the circle 708, is around 1.6 dB and 1.5 dB for PA-SW-OFF and PA-SW-ON, respectively. Furthermore, the NF at 165 GHz, as denoted by the circle 709, is around 3.4 dB and 1.4 dB for PA-SW-OFF and PA-SW-ON, respectively. This further verifies the proposed NF reduction technique by using switching functionality in the power amplifier side, i.e., to switch the power amplifier operation between PA-SW-OFF and PA-SW-ON around the center frequency over the whole operation frequency range.

Figure 8:
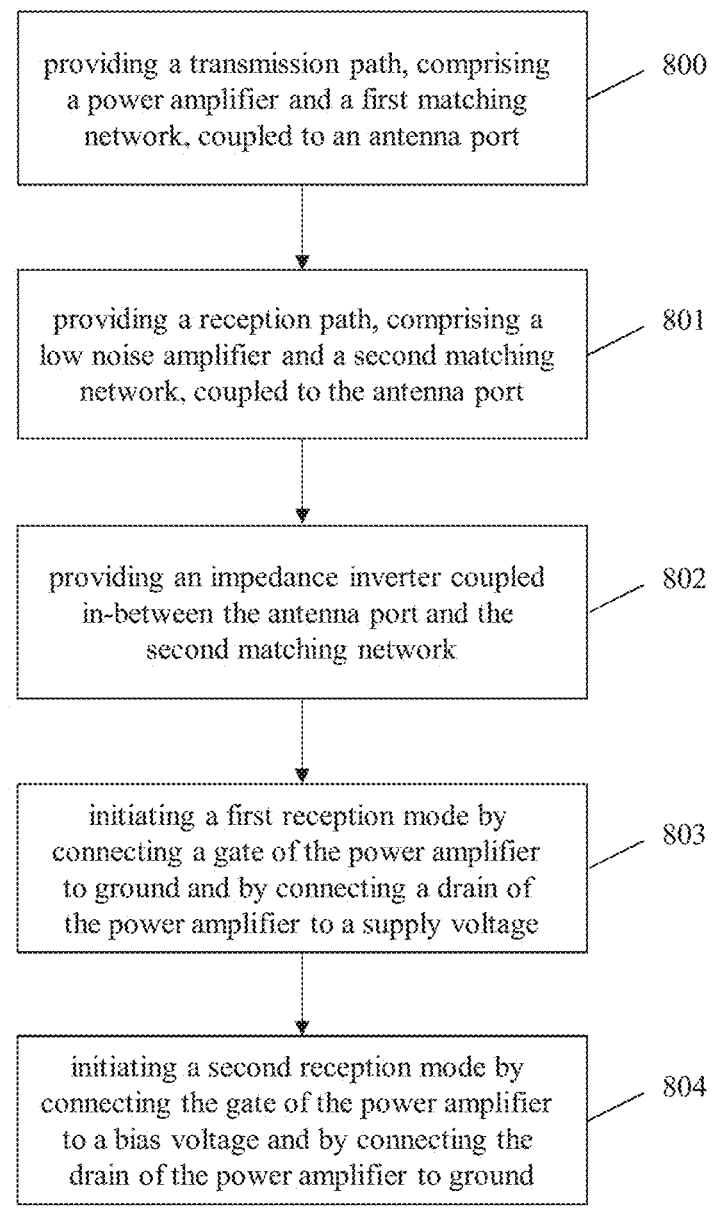
FIG. 8 shows a method according to an example embodiment.

Next, FIG. 8 illustrates an example embodiment of the method using blocks 800-804. At block 800, a transmission path is provided that comprises a power amplifier and a first matching network, where the transmission path is coupled to an antenna port.

Next, at block 801, a reception path is provided that comprises a low noise amplifier and a second matching network, where the reception path is coupled to the antenna port.

Next, at block 802, an impedance inverter is provided that is coupled in-between the antenna port and the second matching network.

Next, at block 803, a first reception mode is initiated by connecting a gate of the power amplifier to ground and by connecting a drain of the power amplifier to a supply voltage.

Next, at block 804, a second reception mode is initiated by connecting the gate of the power amplifier to a bias voltage and by connecting the drain of the power amplifier to ground.

In at least some embodiments of the method represented by FIG. 8, a transmission mode is initiated by switching on a shunt switch coupled to the low noise amplifier and further by connecting the gate of the power amplifier to a bias voltage and the drain of the power amplifier to the supply voltage.

The example embodiments can be implemented by hardware, software, or any combination thereof. For example, various embodiments may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

In addition to the one or more implementations illustrated and described herein, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and for any given or particular application.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A wideband radio-frequency transceiver front-end comprising:
   an antenna port;
   a transmission path coupled to the antenna port comprising a power amplifier and a first matching network;
   a reception path coupled to the antenna port comprising a low noise amplifier and a second matching network;
   an impedance inverter coupled in-between the antenna port and the second matching network; and
   a controller comprising a switching arrangement for a gate and a drain of the power amplifier,
   wherein the controller is configured to initiate a first reception mode by connecting the gate of the power amplifier to ground and by connecting the drain of the power amplifier to a supply voltage.

2. The wideband radio-frequency transceiver front-end according to claim 1, wherein the controller is further configured to initiate a second reception mode by connecting the gate of the power amplifier to a bias voltage and by connecting the drain of the power amplifier to ground.

3. The wideband radio-frequency transceiver front-end according to claim 2,
   wherein the wideband radio-frequency transceiver front-end further comprises a shunt switch coupled to the low noise amplifier, and
   wherein the controller is further configured to initiate a transmission mode by switching on the shunt switch, thereby creating a low impedance short across the low noise amplifier.

4. The wideband radio-frequency transceiver front-end according to claim 3, wherein the controller is further configured to connect the gate of the power amplifier to a bias voltage and the drain of the power amplifier to the supply voltage during the transmission mode.

5. The wideband radio-frequency transceiver front-end according to claim 3, wherein the controller is further configured to cause the shunt switch to be off during the first reception mode and/or the second reception mode.

6. The wideband radio-frequency transceiver front-end according to claim 3,
   wherein the controller further comprises a switching arrangement for a gate of the low noise amplifier, and
   wherein the controller is further configured to connect the gate of the low noise amplifier to ground during the transmission mode.

7. The wideband radio-frequency transceiver front-end according to claim 6, wherein the controller is further configured to connect the gate of the low noise amplifier to a bias voltage during the first reception mode and/or the second reception mode.

8. The wideband radio-frequency transceiver front-end according to claim 1,
wherein the controller further comprises a switching arrangement for a gate of the low noise amplifier, and
wherein the controller is further configured to connect the gate of the low noise amplifier to ground during a transmission mode.

9. The wideband radio-frequency transceiver front-end according to claim 1, wherein the impedance inverter includes a quarter-wavelength ($\lambda/4$) transmission line configured to perform a short-to-open impedance transformation.

10. The wideband radio-frequency transceiver front-end according to claim 1,
wherein the controller is further configured to initiate the first reception mode for a frequency band over an operating frequency band greater than or less than or equal to a center frequency, and/or
wherein the controller is further configured to initiate the second reception mode for a frequency band over the operating frequency band greater than or less than or equal to the center frequency.

11. The wideband radio-frequency transceiver front-end according to claim 10, wherein the operating frequency band is in a range of a millimeter band.

12. The wideband radio-frequency transceiver front-end according to claim 11, wherein the operating frequency band goes up to a Terahertz frequency band.

13. The wideband radio-frequency transceiver front-end according to claim 10, wherein the operating frequency band includes a frequency band within a Terahertz frequency band.

14. The wideband radio-frequency transceiver front-end according to claim 1, wherein the first matching network and the second matching network are transformer based matching networks.

15. The wideband radio-frequency transceiver front-end according to claim 14, wherein the transformer based matching networks include transformer-type baluns.

16. A method for operating a wideband radio-frequency transceiver front-end, the method comprising:
providing a transmission path, comprising a power amplifier and a first matching network, coupled to an antenna port;
providing a reception path, comprising a low noise amplifier and a second matching network, coupled to the antenna port;
providing an impedance inverter coupled in-between the antenna port and the second matching network; and
initiating a first reception mode by connecting a gate of the power amplifier to ground and by connecting a drain of the power amplifier to a supply voltage.

17. The method according to claim 16, further comprising:
initiating a second reception mode by connecting the gate of the power amplifier to a bias voltage and by connecting the drain of the power amplifier to ground.

18. The method according to claim 16, further comprising:
initiating a transmission mode by switching on a shunt switch coupled to the low noise amplifier and further by connecting the gate of the power amplifier to a bias voltage and the drain of the power amplifier to the supply voltage.

19. The method according to claim 16, further comprising:
initiating a transmission mode by switching on a shunt switch coupled to the low noise amplifier and further by connecting the gate of the power amplifier to a bias voltage and the drain of the power amplifier to the supply voltage.

20. The method according to claim 16, further comprising:
initiating the first reception mode for a frequency band greater than or less than or equal to a center frequency and initiating the second reception mode for a frequency band greater than or less than or equal to the center frequency over an operating frequency band.

* * * * *